United States Patent
Watanabe et al.

(10) Patent No.: US 10,727,194 B2
(45) Date of Patent: Jul. 28, 2020

(54) SOLDER MATERIAL FOR SEMICONDUCTOR DEVICE

(71) Applicant: FUJI ELECTRIC CO., LTD., Kawasaki (JP)

(72) Inventors: Hirohiko Watanabe, Hachioji (JP); Shunsuke Saito, Hachioji (JP); Yoshitaka Nishimura, Azumino (JP); Fumihiko Momose, Higashi-chikuma-gun (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 7 days.

(21) Appl. No.: 15/688,404

(22) Filed: Aug. 28, 2017

(65) Prior Publication Data
US 2018/0033761 A1   Feb. 1, 2018

Related U.S. Application Data

(63) Continuation of application No. PCT/JP2016/073406, filed on Aug. 9, 2016.

(30) Foreign Application Priority Data

Sep. 17, 2015 (JP) .................................. 2015-184264
Jan. 18, 2016 (JP) .................................. 2016-007022

(51) Int. Cl.
*H01L 23/00* (2006.01)
*C22C 13/02* (2006.01)
(Continued)

(52) U.S. Cl.
CPC ............ *H01L 24/29* (2013.01); *B23K 35/025* (2013.01); *B23K 35/0244* (2013.01);
(Continued)

(58) Field of Classification Search
CPC ................ H01L 24/29; H01L 23/053; H01L 2224/29201; H01L 2224/29211;
(Continued)

(56) References Cited

U.S. PATENT DOCUMENTS 4,170,472 A    10/1979 Olsen et al.
5,393,489 A *  2/1995 Gonya ................. B23K 35/262
                                                          148/400
(Continued)

FOREIGN PATENT DOCUMENTS

CN    102528314 A    7/2012
CN    103551756 A    2/2014
(Continued)

OTHER PUBLICATIONS

English Machine Translation of Chinese Patent CN 103551756 (Year: 2014).*
(Continued)

*Primary Examiner* — Dzung Tran (57) ABSTRACT

To provide a lead-free solder the heat resistance temperature of which is high and thermal conductive property of which are not changed in a high temperature range. A semiconductor device of the present invention includes a solder material containing more than 5.0% by mass and 10.0% by mass or less of Sb and 2.0 to 4.0% by mass of Ag, and the remainder consisting of Sn and inevitable impurities, and a bonding layer including the solder material, which is formed between a semiconductor element and a substrate electrode or a lead frame.

11 Claims, 3 Drawing Sheets

(51) Int. Cl.
    *H01L 23/053*    (2006.01)
    *B23K 35/02*     (2006.01)
    *B23K 35/26*     (2006.01)

(52) U.S. Cl.
    CPC ............ *B23K 35/26* (2013.01); *B23K 35/262* (2013.01); *C22C 13/02* (2013.01); *H01L 23/053* (2013.01); *H01L 2224/2922* (2013.01); *H01L 2224/29201* (2013.01); *H01L 2224/29211* (2013.01); *H01L 2224/29238* (2013.01); *H01L 2224/29239* (2013.01); *H01L 2224/29247* (2013.01); *H01L 2224/29255* (2013.01); *H01L 2224/29272* (2013.01); *H01L 2224/48091* (2013.01); *H01L 2224/48472* (2013.01); *H01L 2224/73265* (2013.01); *H01L 2924/014* (2013.01); *H01L 2924/0105* (2013.01); *H01L 2924/01014* (2013.01); *H01L 2924/01015* (2013.01); *H01L 2924/01023* (2013.01); *H01L 2924/01028* (2013.01); *H01L 2924/01029* (2013.01); *H01L 2924/01047* (2013.01); *H01L 2924/01051* (2013.01); *H01L 2924/10272* (2013.01); *H01L 2924/13055* (2013.01); *H01L 2924/181* (2013.01); *H01L 2924/19107* (2013.01); *H01L 2924/3656* (2013.01)

(58) Field of Classification Search
    CPC ... H01L 2224/2922; H01L 2224/29238; H01L 2224/29239; H01L 2224/29247; H01L 2224/29255; H01L 2224/29272; B23K 35/0244; B23K 35/025; B23K 35/26; B23K 35/262; C22C 13/02
    USPC ........................................................ 257/779
    See application file for complete search history.

(56) References Cited

U.S. PATENT DOCUMENTS

| | | | | |
|---|---|---|---|---|
| 6,592,020 | B1* | 7/2003 | Currie | B23K 35/025 |
| | | | | 148/23 |
| 2003/0037959 | A1* | 2/2003 | Master | H01L 23/145 |
| | | | | 174/256 |
| 2007/0125449 | A1 | 6/2007 | Kajiwara et al. | |
| 2007/0145546 | A1* | 6/2007 | Lewis | H01L 23/3735 |
| | | | | 257/675 |
| 2007/0295528 | A1 | 12/2007 | Nishi et al. | |
| 2008/0079021 | A1* | 4/2008 | Bayerer | H01L 23/373 |
| | | | | 257/177 |
| 2010/0143658 | A1* | 6/2010 | Lawrence | B23K 35/3612 |
| | | | | 428/172 |
| 2013/0098506 | A1 | 4/2013 | Toyoda et al. | |
| 2016/0035690 | A1 | 2/2016 | Kido et al. | |
| 2016/0056570 | A1 | 2/2016 | Yoshikawa et al. | |
| 2016/0279741 | A1 | 9/2016 | Ukyo et al. | |
| 2018/0277506 | A1 | 9/2018 | Watanabe et al. | |

FOREIGN PATENT DOCUMENTS

| | | |
|---|---|---|
| JP | 40-16897 | 8/1965 |
| JP | 7-284983 | 10/1995 |
| JP | 8-1372 | 1/1996 |
| JP | 2001-35978 | 2/2001 |
| JP | 2001-252787 | 9/2001 |
| JP | 2005-116702 | 4/2005 |
| JP | 2006-35310 | 2/2006 |
| JP | 2007-152385 | 6/2007 |
| JP | 2008-31550 | 2/2008 |
| JP | 2011-121062 | 6/2011 |
| JP | 2012-119609 | 6/2012 |
| JP | 201457974 A | 4/2014 |
| JP | 201570052 A | 4/2015 |
| JP | 2016179498 A | 10/2016 |
| WO | WO 2011/151894 A1 | 12/2011 |
| WO | 2014163167 A1 | 10/2014 |
| WO | WO 2014/181883 A1 | 11/2014 |
| WO | 2016179358 A1 | 11/2016 |
| WO | 2017217145 A1 | 12/2017 |

OTHER PUBLICATIONS

International Search Report dated Oct. 4, 2016 in corresponding International Patent Application No. PCT/JP2016/073406.
Chinese Office Action dated Sep. 9, 2019 from Chinese Patent Application No. 201680013332.0, 15 pages.
Japanese Office Action dated Mar. 6, 2020 from Japanese Patent Application No. 2019-003395, 13 pages.
Japanese Office Action dated Mar. 6, 2020 from Japanese Patent Application No. 2019-067991, 15 pages.
Japanese Office Action dated Feb. 7, 2020 from Japanese Patent Application No. 2019-67991, 14 pages.

* cited by examiner

SOLDER MATERIAL FOR SEMICONDUCTOR DEVICE

CROSS-REFERENCE TO RELATED APPLICATIONS

This application is a Continuation of PCT Application No. PCT/JP2016/073406 filed on Aug. 9, 2016, and claims benefit of foreign priority to Japanese Patent Application No. 2015-184264, filed on Sep. 17, 2015 and Japanese Patent Application No. 2016-007022, filed on Jan. 18, 2016, the entire contents of which are incorporated by reference herein.

BACKGROUND OF THE INVENTION

Technical Field

The present invention relates to a solder material, and more particularly, relates to a highly reliable solder material used for bonding of a semiconductor device.

Background Art

In recent years, Pb-free solders containing no lead components have replaced Sn—Pb-based solders from an environmental viewpoint. Among available lead-free solders of different compositions which are usable as a solder material applied to an IGBT module (power module) or other such semiconductor devices, a Sn—Ag-based Pb-free solder is often adopted because of relatively well-balanced properties particularly in terms of bondability (solder wettability), mechanical characteristics, thermal resistance, etc. as well as due to the fact that it has been actually applied to products.

It is known that in a semiconductor device having a layered bonding structure containing a radiator plate, an insulating substrate placed on the sink, and a semiconductor element attached thereonto by solder bonding, a solder bonding structure is used, in which a Sn—Sb-based solder as a high-temperature lead-free solder is applied to a lower bonding portion, and a lead-free solder is applied to an upper bonding portion, the lead-free solder having such a composition that an element such as Cu is added to a Sn—Ag-based solder having a lower melting point than the Sn—Sb-based solder (see, for example, Patent Literature 1).

Also, the following structure is known as well: a lead frame, also serving as a heat spreader, is bonded as a wire member onto an upper electrode of a semiconductor element (IGBT) mounted by soldering onto an insulating substrate, and heat generated in a semiconductor element is let to dissipate to the lead frame so as to prevent the generated heat from accumulating in a certain portion (see, for example, Patent Literature 2).

A Sn—Sb—Ag-based tape- or wire-like solder material, having high rolling property at 170° C. and high cold forming property, has been also known as a solder material effective to avoid cracking at high temperature resulting from heat generation of the semiconductor element (see, for example, Patent Literature 3).

LIST OF PRIOR ART REEFRENCES

Patent Literature

Patent Literature 1: JP 2001-35978 A
Patent Literature 2: JP 2005-116702 A
Patent Literature 3: JP H7-284983 A

SUMMARY OF INVENTION

Technical Problem

MOS or IGBT elements called a power semiconductor generate heat by themselves during operations, and reach high temperatures. Through repetitive heat generation and cooling, the solder-bonded element repeatedly suffers from distortion at a soldered portion and consequently deteriorates. It is preferable to use a solder alloy excellent in heat radiation for bonding a semiconductor element that operates at high temperatures. A SnAg-based solder material as a typical Pb-free solder increases heat resistance and lowers heat radiation characteristics as the temperature rises. In case of using a SnAg-based solder material that decreases thermal conductivity rate at high temperature at a bonding portion of a power semiconductor subject to heat cycles for a long time, if a larger amount of power is applied, the semiconductor may generate more heat.

In recent years, demand for power semiconductors with high current specifications has increased and accordingly, elements tend to generate a large amount of heat. Also, there is increasing demand for in-vehicle power semiconductors or other such devices capable of operating at an environmental temperature of over 175° C. In such circumstances, low thermal conductivity rate of a solder could be a bottleneck to power supply relative to an applicable output of the element. In case the thermal conductivity rate of a solder lowers when the element temperature rises from the room temperature to high temperature due to self-heating or environmental temperature, a chip cannot easily release the heat. Consequently, the chip temperature further increases. Currently, it is earnestly desired to ensure that the maximum of power applied to an element is used so that the element can be used even if generating heat with the temperature closer to a melting point of a solder. In order to meet such a demand, a solder material that is less likely to lower its thermal conductivity rate at high temperature is required.

Solution to Problem

The inventors of the present invention have made extensive studies and found that if Sb is further added to the SnAg-based solder and the resultant is controlled within the range of specific composition percentages, a preferable solder material is achieved, which has no fear of lowing thermal conductivity rate along with the temperature rise and excels in bonding characteristics such as wettability. In this way, the inventors have accomplished the present invention.

More specifically, according to one aspect of the present invention, a solder material comprises more than 5.0% by mass and 10.0% by mass or less of Sb, 2.0 to 4.0% by mass of Ag, and the remainder consisting of Sn and inevitable impurities.

It is preferred that the solder material comprising Sb, Ag and Sn further comprises more than 0 and 1.0% by mass or less of Ni.

It is preferred that the solder material comprising Sb, Ag and Sn further comprises 0.1 to 0.4% by mass of Ni.

It is preferred that the solder material comprising Sb, Ag and Sn further comprises more than 0 and 1.0% by mass or less of Si.

It is preferred that the solder material comprising Sb, Ag and Sn further comprises more than 0 and 0.1% by mass or less of V.

It is preferred that the solder material comprising Sb, Ag and Sn further comprises more than 0 and 1.2% by mass or less of Cu.

It is preferred that any one of the solder materials further comprises 0.001 to 0.1% by mass of P.

It is preferred that any one of the solder materials further comprises 0.001 to 0.1% by mass of Ge.

In any one of the above solder materials, it is preferred that a thermal conductivity rate at 100° C. to 200° C. is not lower than a thermal conductivity rate at 25° C.

According to another aspect of the present invention, a semiconductor device comprises a bonding layer in which any one of the above solder materials is melted, between a semiconductor element and a substrate electrode or a lead frame.

It is preferred that in the semiconductor device, the semiconductor element is a SiC semiconductor element.

Advantageous Effects of Invention

The solder material according to the present invention preferably increases thermal conductivity rate along with the temperature rise without decreasing it along with the temperature rise. Thus, it has high heat radiation characteristics and provides an effect of increasing a heat fatigue life. Also, the solder material according to the present invention has a high wettability, and can suppress the generation of voids in the solder bonding layer to a lower level. The solder material according to the present invention is particularly preferable for use in a solder die bonding portion used at the temperature condition, Tr=0.6 or more, which corresponds to the melting point of the material. Note that Tr represents a ratio of the operation temperature to the melting point and is expressed by Tr=Tm/Tj where Tm indicates the melting point and Tj indicates the operation temperature (the unit is K for both). Here, the void means a gap formed inside the solder bonding layer or at the bonding interface. If the wettability between the solder and the bonding member is low at the bonding temperature, there is a problem that voids easily occur in such a way that the air or other gases are taken in or the solder is solidified while being recessed. The present invention is advantageous in that voids are less likely to occur. Moreover, the solder material according to the present invention further contains a predetermined amount of Ge to prevent oxidization of Sn and improve the wettability.

Also, the semiconductor device including the solder material according to the present invention as a bonding layer has high heat radiation characteristics and thus is suitable for the application where an element that generates a large amount of heat is mounted or the use at high environmental temperatures. In addition, the solder material ensures reduction in size and costs of the device. Also, few voids are formed in the bonding layer, whereby the service life is increased. Hence, the solder material is preferably applicable to electronic devices with large current specifications, for which demands are increasing, especially for a wide variety of semiconductor devices, for die bonding of the semiconductor device, bonding between terminals, and bonding between the other members.

DESCRIPTION OF EMBODIMENTS

Embodiments of the present invention will be described below with reference to attached drawings. However, the present invention is not limited by the embodiments described below.

First Embodiment: Sn—Sb—Ag Ternary Alloy

According to the first embodiment of the present invention, a solder material contains more than 5.0% by mass and 10.0% by mass or less of Sb and 2.0 to 4.0% by mass of Ag, and the remainder consists of Sn and inevitable impurities. The inevitable impurities generally imply Cu, Ni, Zn, Fe, Al, As, Cd, Au, In, P, Pb, etc. The solder material of the present invention is a lead-free solder alloy that does not contain Pb. As the solder material mainly consisting of Sn contains Ag, and Sb in the above composition ranges, the wettability of the solder material is ensured, and these elements influence a thermal diffusion path of the alloy constituting the solder material to keep its thermal diffusivity rate low. As a result, even if the temperature rises, the thermal conductivity rate of the alloy is not decreased so much.

It is more preferred that the solder material contains 6.0 to 8.0% by mass of Sb and 3.0 to 4.0% by mass of Ag, and the remainder consists of Sn and inevitable impurities. These composition ranges make it possible to increase the thermal conductivity rate of the alloy along with the temperature rise in addition to the above advantages.

Second Embodiment: Sn—Sb—Ag—Ni Quaternary Alloy

According to the second embodiment of the present invention, a solder material contains more than 5.0% by mass and 10.0% by mass or less of Sb, 2.0 to 4.0% by mass of Ag, and more than 0 and 1.0% by mass or less of Ni, and the remainder consists of Sn and inevitable impurities. Further adding Ni in the aforementioned addition ranges to the composition of the first embodiment gives an advantage that a thermal diffusion path of the alloy is influenced to increase its thermal conductivity rate as well as improve the wettability, whereby the resultant bonding layer has a low void fraction. Also, Ni has a high melting point and thus can increase the strength at high temperature. In particular, the above addition ranges are set so as to control the melting point of the solder material within a possible range of solid solution since the melting point of the solder material exceeds 300° C. when Ni is added beyond the above range.

More preferably, the solder material contains 6.0% by mass to 8.0% by mass of Sb, 3.0 to 4.0% by mass of Ag, and 0.01 to 0.5% by mass of Ni, and the remainder consists of Sn and inevitable impurities. These composition ranges give an advantage of further lowering the melting point of the solder material to 260° C. or less in addition to the above advantages.

Third Embodiment: Sn—Sb—Ag—Si Quaternary Alloy

According to the third embodiment of the present invention, a solder material contains more than 5.0% by mass and 10.0% by mass or less of Sb, 2.0 to 4.0% by mass of Ag, and more than 0 and 1.0% by mass or less of Si, and the remainder consists of Sn and inevitable impurities. Further adding Si to the composition of the first embodiment gives an advantage that a thermal diffusion path of the alloy is influenced to increase its thermal conductivity rate as well as improve the wettability, whereby the resultant bonding layer has a low void fraction. Also, Si has a high melting point and thus can increase the strength at high temperature. In particular, the above addition ranges are set to ensure solid solution of Si, which is originally hard to achieve. Also, if Si that is a material having a high melting point, is added more than the above range, the melting point of the solder material excessively increases to over 300° C. in some cases.

More preferably, the solder material contains 6.0% by mass to 8.0% by mass of Sb, 3.0 to 4.0% by mass of Ag, and 0.1 to 0.4% by mass of Si, and the remainder consists of Sn and inevitable impurities. These composition ranges give an advantage of controlling the melting point of the solder material to 260° C. or lower in addition to the above advantages.

Fourth Embodiment: Sn—Sb—Ag—Ni—Si Quinary Alloy

According to the fourth embodiment of the present invention, a solder material contains more than 5.0% by mass and 10.0% by mass or less of Sb, 2.0 to 4.0% by mass of Ag, more than 0 and 1.0% by mass or less of Ni, and more than 0 and 1.0% by mass or less of Si, and the remainder consists of Sn and inevitable impurities. By using the quinary alloy in which Ni and Si coexist as additive elements, the following advantage can be obtained: the interface strength and the strength of a bulk against high temperature increase, i.e., the strength to high temperature increases due to the synergistic effect of Ni and Si.

More preferably, the solder material contains 6.0% by mass to 8.0% by mass of Sb, 3.0 to 4.0% by mass of Ag, 0.01 to 0.5% by mass of Ni, and 0.1 to 0.4% by mass of Si, and the remainder consists of Sn and inevitable impurities.

Fifth Embodiment: Sn—Sb—Ag—V Quaternary Alloy

According to the fifth embodiment of the present invention, a solder material contains more than 5.0% by mass and 10.0% by mass or less of Sb, 2.0 to 4.0% by mass of Ag, and more than 0 and 0.1% by mass or less of V, and the remainder consists of Sn and inevitable impurities. Further adding V to the composition of the first embodiment gives an advantage that a thermal diffusion path of the alloy is influenced to increase its thermal conductivity rate as well as improve the wettability, whereby the resultant bonding layer has a low void fraction. In particular, the above addition ranges are set because V has a high melting point and thus can increase the strength at high temperature. If V that is a material having a high melting point is added more than the above ranges, the melting point of the solder material excessively increases and sometimes exceeds, for example, 300° C. Also, solid solution might not be achieved easily.

More preferably, the solder material contains 6.0% by mass to 8.0% by mass of Sb, 3.0 to 4.0% by mass of Ag, and 0.01 to 0.08% by mass of V, and the remainder consists of Sn and inevitable impurities. Although the melting point of the solder material might excessively increase if V that is a material having a high melting point is added more than the above ranges, it is possible by limiting to these composition ranges to control the melting point to 250° C. or lower, in addition to the above advantages. Also, adding an excessive amount of V produces an oxide, which is hardly mixed with metals, and voids are easily formed in some cases.

Sixth Embodiment: Sn—Sb—Ag—Cu Quaternary Alloy

According to the sixth embodiment of the present invention, a solder material contains more than 5.0% by mass and 10.0% by mass or less of Sb, 2.0 to 4.0% by mass of Ag, and more than 0 and 1.2% by mass or less of Cu, and the remainder consists of Sn and inevitable impurities. Further adding Cu to the composition of the first embodiment gives an advantage that a thermal diffusion path of the alloy is influenced to increase its thermal conductivity rate as well as improve the wettability, whereby the resultant bonding layer has a low void fraction. The above addition ranges are advantageously set because particularly in case of bonding a Cu member, a melting point is not increased for the Cu member, that is, the melting point is insensitive to its composition, and the composition margin is large with small variations in components. Also, these ranges are preferable in that Cu in a Cu plate is prevented from melting in the solder material.

More preferably, the solder material contains 6.0% by mass to 8.0% by mass of Sb, 3.0 to 4.0% by mass of Ag, and 0.1 to 0.9% by mass of Cu, and the remainder consists of Sn and inevitable impurities. These composition ranges give an advantage of particularly high wettability in addition to the above advantages.

Seventh Embodiment: Sn—Sb—Ag—Ge Quaternary Alloy

According to the seventh embodiment of the present invention, a solder material is an alloy containing more than 5.0% by mass and 10.0% by mass or less of Sb, 2.0 to 4.0% by mass of Ag, and 0.001 to 0.1% by mass of Ge, and the remainder consists of Sn and inevitable impurities. Further adding Ge to the composition of the first embodiment has an advantage that Sn is kept from oxidizing, the solder wettability largely increases by such addition, and thus, the thermal diffusion path of the alloy is influenced. The addition amount of Ge is more preferably 0.003 to 0.05% by mass. By adding Ge in this range, GeO is not produced excessively but is produced in an appropriate amount so as to suppress the oxidization of Sn the oxide of which cannot be easily reduced and removed. Also, this provides an effect of suppressing the void formation. The amount is more preferably 0.003% by mass or more and less than 0.005% by mass.

More preferably, the solder material contains 6.0% by mass to 8.0% by mass of Sb and 3.0 to 4.0% by mass of Ag and contains Ge in any of the above ranges, and the remainder consists of Sn and inevitable impurities. These composition ranges make it possible to suppress the oxidization of Sn as well as increase the thermal conductivity rate of an alloy along with the temperature rise.

Eighth Embodiment: Sn—Sb—Ag—Ge—Ni Quinary Alloy

According to the eighth embodiment of the present invention, a solder material contains more than 5.0% by mass and 10.0% by mass or less of Sb, 2.0 to 4.0% by mass of Ag, 0.001% by mass to 0.1% by mass of Ge, and more than 0 and 1.0% by mass or less of Ni, and the remainder consists of Sn and inevitable impurities. The addition amount of Ni is more preferably 0.1 to 0.4% by mass. Further adding Ni to the composition of the seventh embodiment gives an advantage that the interface strength of the solder can be improved together with the wettability improving effect of Ge. Another advantage is that Ni has a high melting point and thus can increase the strength at high temperature.

More preferably, the solder material contains 6.0% by mass to 8.0% by mass of Sb, 3.0 to 4.0% by mass of Ag, and 0.01 to 0.5% by mass of Ni, and the remainder consists of Sn and inevitable impurities. These composition ranges provide an effect of controlling the melting point of the solder material to 260° C. or less in addition to the above advantages.

To give another modified example, P can be added to the solder material of the first to eighth embodiments. For example, the material can contain, for example, 0.001% by mass to 0.1% by mass of P. This aims at increasing the wettability because P has an effect of suppressing the oxidization of the solder material. The solder material of the first to sixth embodiments can contain Ge in place of, or in addition to P. This is because Ge also has an effect of suppressing the oxidization of the solder material and can influence the thermal diffusion path of the alloy. The addition amount of Ge can be set to 0.001 to 0.1% by mass in this case, preferably, 0.003 to 0.02% by mass, and more preferably 0.003 or more and less than 0.005% by mass. In case of adding Ge and P together, their addition amounts can be appropriately chosen from the above ranges. Both of Ge and P oxidize more easily than Sn, and if added in these addition ranges, they can prevent oxidization of Sn and ensure the wettability of the solder material.

In all of the first to eighth embodiments and the modified examples thereof, the resultant solder material has such thermal conductive property that the thermal conductivity rate detected at 100° C. to 200° C. is not lower than the one at 25° C. Here, "the thermal conductivity rate detected at 100° C. to 200° C. is not lower than the one at 25° C." means that the thermal conductivity rate of the solder material detected at a certain temperature from 100° C. to 200° C. is equal to or higher than the one at 25° C. Insofar as the above condition is met at a certain temperature from 100° C. to 200° C., the thermal conductivity rate may gradually increase within the range of 100° C. to 200° C., or can temporarily increase and then decrease in this range. Alternatively, it can remain unchanged. Owing to the above characteristics, the solder material can be suitably used in a high temperature range. The solder material of the present invention preferably has such a thermal conductivity rate as monotonously increases in the range of 100° C. to 200° C. Moreover, it is preferred that the thermal conductivity rate of the solder material at a certain temperature from more than 25° C. to 100° C. is also equal to or higher than the one at 25° C., but in the range of more than 25° C. to 100° C., the thermal conductivity rate may be slightly decreased temporarily. For example, the following solder material can be also given as a preferred example of the present invention: the solder member has such thermal conductive property that a relationship between the temperature and the thermal conductivity rate is expressed by a curve that is convex downward and preferably has at least one inflection point in the range of more than 25° C. to 100° C., and $\lambda_{IP}/\lambda_{25}=0.9$ or more where $\lambda_{25}$ indicates the thermal conductivity rate at 25° C. and $\lambda_{IP}$ indicates the thermal conductivity rate at the inflection point. In any case, the measurements of thermal conductivity rate involve an error of about 10%. Note that the thermal conductivity rate $\lambda$ can be determined by a steady state method such as a temperature gradient method or an unsteady method that determines a thermal diffusivity rate using a laser flash method, a hot wire method, etc. More specifically, the thermal conductivity rate $\lambda$ can be derived from:

$$\lambda = \alpha \times \rho Cp \qquad \text{(Expression 1)}$$

where $\rho$ indicates the density, Cp indicates specific heat, and $\alpha$ indicates a thermal diffusivity rate The density can be calculated by the Archimedes' method, the specific heat can be calculated by a DSC (Differential scanning calorimetry) method, and the thermal diffusivity rate can be calculated by the laser flash method. Note that the thermal conductivity rate $\lambda$ can be measured by using a method compliant with JIS R1611, R1667, H7801, H8453, etc.

In all of the first to eighth embodiments and the modified examples thereof, the solder material of the present invention can be prepared by melting materials selected from Sn, Sb, Ag, and additive elements or a mother alloy containing the materials in an electric furnace in accordance with an ordinary method. It is preferable to use materials with a purity of 99.99% by mass or higher.

According to the first to eighth embodiments and the modified examples thereof, the solder material can be worked in the form of a plate-like preform material or a solder paste prepared by powdering the materials and mixing the powder with a flux. If the solder material is to be provided in the form of a solder paste prepared by working the materials into the form of powder and mixing the powder with a flux, with respect to the particle size of the powdered solder, it is preferable to use a powdered solder of which the distribution of the particle size is in the range of 10 to 100 μm, and more preferably, 20 to 50 μm. For an average particle size, a powdered solder can be used of which the distribution of the particle size is in the range of 25 to 50 μm, for example, by measurement carried out by using a common laser diffraction and scattering-type particle-size-distribution measuring apparatus. For the flux, a freely selected flux can be used, and in particular, a rosin based flux can be preferably used.

According to the first to eighth embodiments of the present invention and the modified examples thereof, a member to be bonded by the solder material can be a common electronic device member including a metal member at least at a bonding surface. A typical example thereof is a metal member that functions as an electrode. An electrode member consisting of, for example, Cu, Ag, Au, Ni, or Fe, or an alloy thereof, can be used.

According to the first to eighth embodiments of the present invention and the modified examples thereof, the solder material can be used for a semiconductor device, for example. In particular, it is usable for die bonding, bonding between terminals, bonding between a terminal and other member, and for any other bonding. However, its application is not limited to the above bonding. The member is preferably used particularly for die bonding for a device used in a high temperature environment, e.g., at 175° C. or higher. As the device used in a high temperature environment, e.g., at 175° C. or higher, there are, for example, an inverter, a mega solar, a fuel cell, an elevator, a cooling device, an in-vehicle semiconductor device, etc. However, the present invention is not limited thereto. The solder material is preferably used particularly for bonding a semiconductor element such as Si or SiC, or a Peltier element in these devices. Note that the solder material of the present invention has the aforementioned thermal conductive property and preferably, its thermal conductivity rate shows a roughly monotonous increase at 100° C. or more and the material is melted almost at 240° C. or higher. Hence, the solder material is preferably applicable to a device that may possibly be used under temperature conditions in such a range.

According to the first to eighth embodiments of the present invention and the modified examples thereof, the solder material does not decrease its thermal conductivity rate even at high temperature and has excellent heat radiation characteristics. Thus, even when used for die bonding of an electronic device member having an element that will generate a large amount of heat and/or an electronic device member used in a high temperature environment, the solder material is less likely to cause distortions and ensures the formation of a highly reliable, long-life bonding layer. Also, the solder material shows a high wettability and can largely reduce a void fraction in the bonding layer. The voids might lower the heat radiation characteristics, lead to a failure of the solder due to locally generated heat, or make Si melted in case of bonding a Si semiconductor element, but according to the present invention, such risks can be satisfactorily reduced.

Ninth Embodiment: Semiconductor Device

According to the ninth embodiment of the present invention, a semiconductor device includes a bonding layer between a semiconductor element and a substrate electrode or a lead frame, the bonding layer being prepared by melting the solder material of the above first to eighth embodiments or the modified examples thereof.

Figure 1:
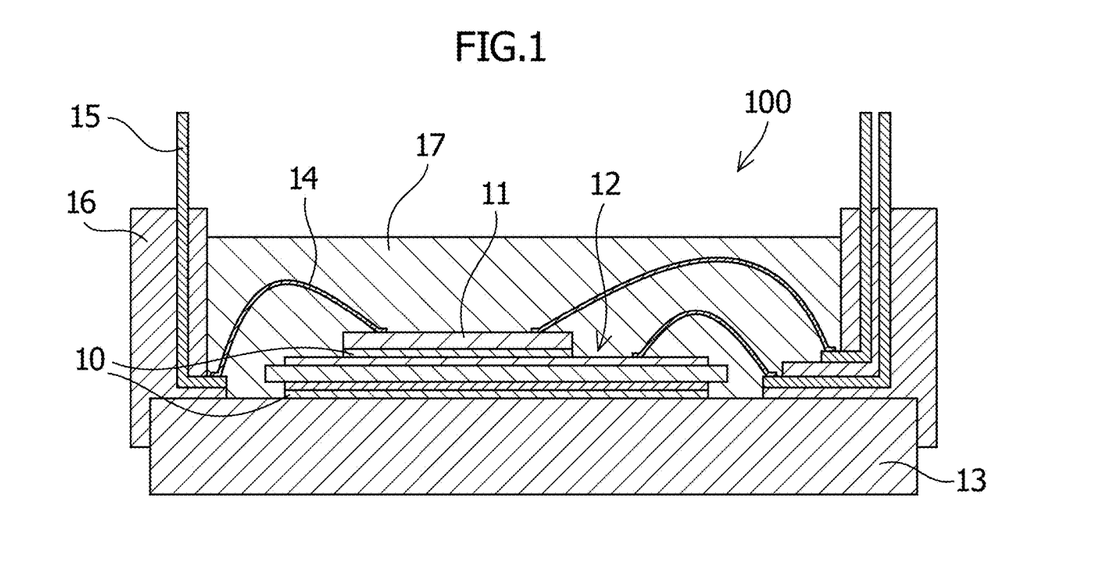
FIG. 1 is a conceptual diagram showing an example of a semiconductor device in which a solder material according to the present invention is used as a bonding layer.

FIG. 1 is a conceptual cross-sectional view of a power module as an example of the semiconductor device of this embodiment. A power module 100 has a laminate structure formed by mainly bonding a semiconductor element 11 and a laminate substrate 12 onto a radiator plate 13 with a bonding layer 10. The bonding layer 10 is formed by melting the solder material of the above first to eighth embodiments or the modified examples thereof under a predetermined bonding temperature profile and then cooling the resultant. The radiator plate 13 is attached to a case 16 incorporating an external terminal 15, and electrodes of the semiconductor element 11 and the laminate substrate 12 are connected with the external terminal 15 via an aluminum wire 14. The module is filled with a resin sealing material 17.

The semiconductor element 11 may be a Si semiconductor element or a SiC semiconductor element, but the present invention is not limited thereto. For example, if the elements are mounted on an IGBT module, back electrodes of the elements, which are to be bonded to a conductive metal plate of the laminate substrate 12, are generally made of Au. The laminate substrate 12 has a conductive metal plate made of copper or aluminum, which is formed on the front or back surface of a ceramic insulating layer made of, for example, alumina, SiN, or the like. The radiator plate 13 may be formed of metal having high thermal conductivity rate such as copper or aluminum. The solder material of the present invention is preferably used as a material for the bonding layer 10 between the back electrode of the semiconductor element 11 and the conductive metal plate on the front side of the laminate substrate 12 or as a material for the bonding layer 10 between a conductive metal plate on the back side of the laminate substrate 12 and the radiator plate 13. The thickness, shape, etc. of the solder material used for forming the bonding layer 10 can be appropriately set according to its purpose or application without any particular limitation. However, the solder material of the present invention has a higher wettability than conventional techniques and is less likely to cause voids, and thus can be thinned. As the thin solder material is low in heat resistance, it is preferable to use the material in the semiconductor device. On the other hand, if a chip of the semiconductor element 11 warps, the thickness of the solder material has to be increased accordingly. In this case, there is a fear that voids are easily formed, but the high wettability makes it possible to avoid the formation of voids. In addition, the large thickness provides an effect of relaxing stress and thus ensures long life. On this account, the solder material can be formed thin or thick, and the flexibility of design can be increased.

Note that the semiconductor device of this embodiment is illustrated as an example, and the semiconductor device of the present invention is not limited to the device having the illustrated device structure. For example, in the semiconductor device structure with a lead frame as disclosed in Patent Literature 2 by the applicant of the present invention, a solder material of the present invention can be used for bonding the lead frame and the semiconductor element. Alternatively, in the semiconductor device having the structure as disclosed in JP 2012-191010 A by the applicant of the present invention, the solder material of the present invention can be used for bonding a copper block and the semiconductor element. Furthermore, the solder material of the present invention can be also used for solder bonding (solder bonding portions) in the semiconductor device such as bonding between terminals or bonding between the semiconductor element and the terminal, in addition to the above die bonding.

Examples (1) Measurements of Thermal Conductivity Rate and Wettability

A solder material of the present invention and a solder material of Comparative Example were prepared, and the thermal conductivity rate and wettability were measured for both of them. The thermal conductivity rate of the solder material was derived from Expression 1 above; the density was calculated by the Archimedes' method, the specific heat was calculated by the DSC method, and the thermal diffusivity rate was calculated by the laser flash method. Note that the measurements involve an error of about 10%. The thermal conductivity rate was measured at 25° C., 100° C., 150° C., 175° C., and 200° C. for samples of compositions to determine if the thermal conductivity rate of the solder material measured at 100° C., 150° C., 175° C., and 200° C. is equal to or higher than the thermal conductivity rate at 25° C. The sample that satisfies this condition is given "Y (yes)", or otherwise "N (no)".

The samples for the wettability measurement were prepared by bonding a 9 mm square Si chip and the conductive metal plate (copper) of the laminate substrate 12 into a 110 μm-thick bonding layer, using the solder material of the present invention and the solder material of Comparative Example. The bonding was carried out by keeping the material for two minutes at the liquidus temperature +30° C. as a melting point of the solder material. The solder bonding portion was observed by SAT (Scanning Acoustic Tomography). From the SAT radioscopy image (transmission image), the void fraction was calculated on the assumption that the chip area is 100%. The solder material having the void fraction of 1.5% or less relative to the chip area is assumed to have a wettability and given "Y (yes)", and the material having the void fraction of more than 1.5% is assumed not to have a wettability and given "N (no)". The results are summarized in Table 1 below. Although detailed data is not shown, the inventors of the present invention measured the relationship between an Ag content and the surface tension in a Sn—Ag-based solder by using a Wilhelm method. The measurement result from the Wilhelm test reveals that the surface tension is smallest at around Sn-3.5 mass % Ag, particularly at Sn-3.0 mass % Ag to Sn-4.0 mass % Ag. This result matches the measurement result of the void fraction in this example. The above reveals that lowering the surface tension is effective for reducing the void fraction. As for the solder wettability, it can be thought that if the surface tension is as small as possible, the contact angle is decreased to ensure the high wettability with respect to the base member (member to be bonded).

In Table 1, Samples 1 to 7 and 24 correspond to Comparative Examples, and the others correspond to Examples.

Although a SnAg-based material is generally used as the solder material, the thermal conductivity rate of SnAg or SnAgCu-based alloy is decreased along with the temperature rise. Note that data about the thermal conductivity rate is not shown in Table 1. On the other hand, as for the SnSb-based material, the solid solution effect of Sb was observed in Sn-5Sb, but an influence of μSn was large, and the thermal conductivity rate was slightly decreased along with the temperature rise, compared with an initial one. Here, detailed data is omitted. On the other hand, a Sn6Sb4Ag eutectic solder increased the thermal conductivity rate along with the temperature rise. As a result of adding 13% by mass of Sb to Sn, the wettability lowered. This is supposedly because SbSn and Sb2Sn precipitated. Although the thermal conductivity rate is likely to increase along with the temperature rise compared with an initial value, in case of adding 8% by mass or more of Sb to Sn, the thermal conductivity rate did not change regardless of an Ag content, etc.

Figure 2:
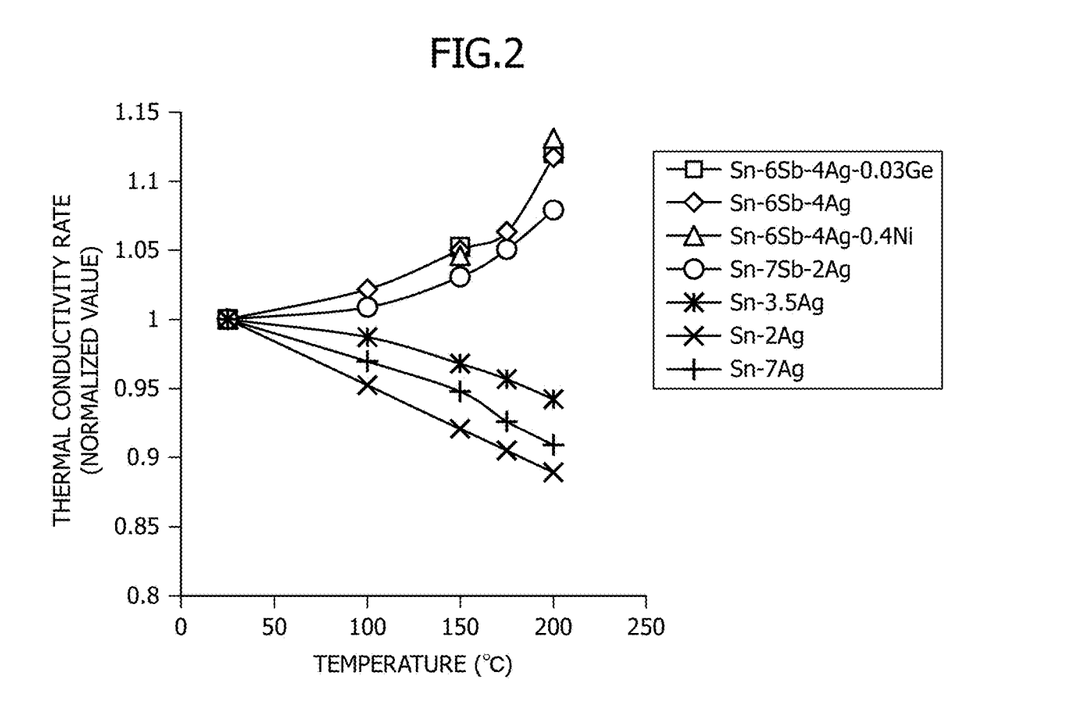
FIG. 2 is a graph showing a relationship between each temperature and thermal conductivity rate in a solder material according to the present invention and that of Comparative Example where the thermal conductivity rate at each temperature is a normalized value based on the thermal conductivity rate at 25° C.

FIG. 2 shows a relationship between the temperature and the thermal conductivity rate of a representative solder material of the present invention and a solder material of Comparative Example. The thermal conductivity rate is expressed as a normalized value based on the thermal conductivity rate at 25° C. It can be understood from the normalized values in the graph that Samples 8, 9, 13, and 20 as the solder material of the present invention increased the thermal conductivity rate from 25° C. to 200° C. compared

TABLE 1

| Sample No. | | Component mass % | | | | | Characteristics | | |
|---|---|---|---|---|---|---|---|---|---|
| | | Sn | Sb | Ag | Cu | other(s) | liquidus | Thermal conductivity rate | Wettability |
| 1 | Sn—2Ag | Bal. | — | 2 | | | 225.8 | N | N |
| 2 | Sn—3.5Ag | Bal. | — | 3.5 | | | 220.5 | N | N |
| 3 | Sn—5Ag | Bal. | — | 5 | | | 248.2 | N | N |
| 4 | Sn—7Ag | Bal. | — | 7 | | | 281.5 | N | N |
| 5 | Sn—5Sb | Bal. | 5 | — | | | 243.5 | N | Y |
| 6 | Sn—13Sb | Bal. | 13 | — | | | 284.6 | Y | N |
| 7 | Sn—13Sb—3Ag | Bal. | 13 | 3 | | | 281.2 | Y | N |
| 8 | Sn—7Sb—2Ag | Bal. | 7 | 2 | | | 246.6 | Y | Y |
| 9 | Sn—6Sb—4Ag | Bal. | 6 | 4 | | | 230 | Y | Y |
| 10 | Sn—9Sb—3Ag | Bal. | 9 | 3 | | | 256 | Y | Y |
| 11 | Sn—6Sb—4Ag—1.0Ni | Bal. | 6 | 4 | | Ni 1.0 | 237.5 | Y | Y |
| 12 | Sn—6Sb—4Ag—2.0Ni | Bal. | 6 | 4 | | Ni 2.0 | 473.9 | Y | N |
| 13 | Sn—6Sb—4Ag—0.4Ni | Bal. | 6 | 4 | | Ni 0.4 | 237.5 | Y | Y |
| 14 | Sn—6Sb—4Ag—0.01Ni | Bal. | 6 | 4 | | Ni 0.01 | 237.5 | Y | Y |
| 15 | Sn—6Sb—4Ag—2.0Cu | Bal. | 6 | 4 | 2.0 | | 293 | Y | N |
| 16 | Sn—6Sb—4Ag—1.2Cu | Bal. | 6 | 4 | 1.2 | | 256.3 | Y | Y |
| 17 | Sn—6Sb—4Ag—0.1Cu | Bal. | 6 | 4 | 0.1 | | 237.5 | Y | Y |
| 18 | Sn—6Sb—4Ag—0.001Ge | Bal. | 6 | 4 | | Ge 0.001 | 230 | Y | Y |
| 19 | Sn—6Sb—4Ag—0.003Ge | Bal. | 6 | 4 | | Ge 0.003 | 230 | Y | Y |
| 20 | Sn—6Sb—4Ag—0.03Ge | Bal. | 6 | 4 | | Ge 0.03 | 230 | Y | Y |
| 21 | Sn—6Sb—4Ag—0.001Ge—0.3Ni | Bal. | 6 | 4 | | Ni 0.3 Ge 0.001 | 235 | Y | Y |
| 22 | Sn—6Sb—4Ag—0.003Ge—0.3Ni | Bal. | 6 | 4 | | Ni 0.3 Ge 0.003 | 235 | Y | Y |
| 23 | Sn—6Sb—4Ag—0.03Ge—0.3Ni | Bal. | 6 | 4 | | Ni 0.3 Ge 0.03 | 235 | Y | Y |
| 24 | Sn—4Ag—0.5Cu—0.07Ni—0.01Ge | Bal. | | 4 | 0.5 | Ni 0.07 Ge 0.01 | 219 | N | Y |
| 25 | Sn—6Sb—4Ag—0.1Si | Bal. | 6 | 4 | | Si 0.1 | 230 | Y | Y |
| 26 | Sn—6Sb—4Ag—1.0Si | Bal. | 6 | 4 | | Si 1.0 | 237 | Y | Y |
| 27 | Sn—6Sb—4Ag—0.3Ni—0.1Si | Bal. | 6 | 4 | | Ni 0.3 Si 0.1 | 235 | Y | Y |
| 28 | Sn—6Sb—4Ag—0.01V | Bal. | 6 | 4 | | V 0.01 | 230 | Y | Y |
| 29 | Sn—6Sb—4Ag—0.1V | Bal. | 6 | 4 | | V 0.1 | 230 | Y | Y | with the one at 25° C. On the other hand, the solder material of Comparative Example obviously lowered the thermal conductivity rate along with the temperature rise.

The following two mechanisms are conceivable as a thermal conductive mechanism:
1. Energy transmission by means of vibrations (phonons and lattice vibrations) transmitted through crystal lattices; and
2. Energy transmission by means of conduction electrons.

In general, the conduction electrons contribute to the thermal conductive in metals or alloys rather than the former. It is accordingly supposed that when the temperature rises, electrons are scattered more and more, leading to a decrease in electron conductivity and also in thermal conductivity rate. On the other hand, alloys constituting the solder material of the present invention might possibly depend on lattice vibrations within a predetermined temperature range rather than the latter. More specifically, when the temperature rises, the lattice vibrations increase and the electrons are scattered more and more. However, if the thermal conductive mainly depends on the lattice vibrations, even in case the contribution of conduction electrons is lowered, the thermal conductivity rate is thought to increase due to the energy transmission by means of the lattice vibrations. Note that the above explanation is merely given for understanding the present invention and the present invention is not limited to a specific theory as above.

(2) Power Cycle Test

Figure 3:
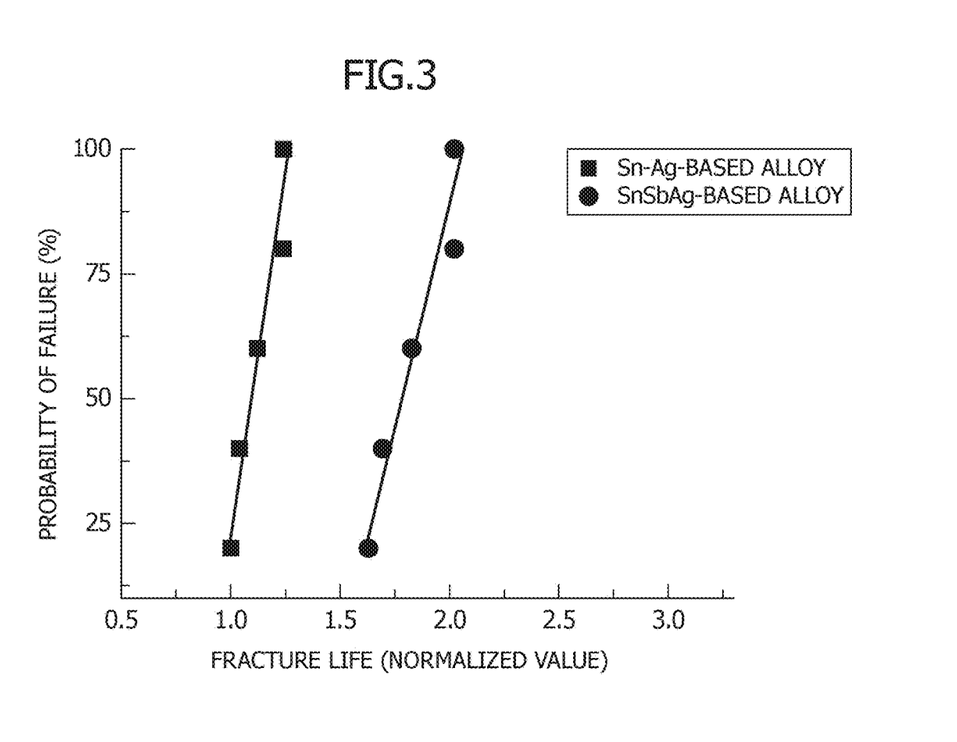
FIG. 3 is a graph showing a relationship between a normalized value of a fracture life and the probability of failure in a solder material according to the present invention and that of Comparative Example.

Power modules having the structure of FIG. 1 were prepared using a SnSbAg-based material as the ternary solder material of the present invention, and a SnAg-based material as the solder material of Comparative Example. These power modules were subject to a power cycle test under the condition that $\Delta Tj=100°$ C., $Tjmax=175°$ C., and one cycle consists of 2 seconds for operation and 9 seconds for pause, so as to obtain the same heat generation temperature. FIG. 3 shows the results thereof. The fracture life is expressed by the number of cycles normalized based on Comparative Example. The vertical axis represents the failure probability obtained by executing the power cycle test on twenty modules, that is, a ratio of power modules failed due to any damage of a solder. In FIG. 3, the numbers of cycles at a predetermined failure probability are plotted. It is determined whether any failure occurs due to any damage of a solder, based on a change in heat resistance of the element. The rate of change in heat resistance of the element was monitored and continuously checked. Then, the element that gradually increases heat resistance was determined to involve damage of a solder. Also, in order to exclude the failure of a wire bonding connection for power supply to the element or the failure due to the deterioration of the element, as for the element that increases the heat resistance and cannot be applied with a rated current, the solder composition was observed in cross-section, and the element having damage of a solder was counted as a failure.

According to the power cycle test or other such test methods which apply a current and make the element generate heat to repeatedly turn on/off the current supply based on the upper and lower limits of the heat generation temperature, a bonding layer warps due to heat generation. After the repetition of several hundred thousands of cycles, the solder material deteriorates, leading to the fracture of the element. In the power cycle test, the solder material initially has fine structure of metal compositions but as it deteriorates, compounds might precipitate, aggregate, and coarsen. On the other hand, the presence of the coarse compounds means that more compositions having less displacement of μSn or compounds exist; these compositions exhibit similar behavior to pure metal and the thermal conductivity rate might be changed. This test also reveals that the solder material of the present invention increases the product life compared with the conventional solder material. This is supposedly because, although not intended to limit the present invention by a specific theory, the SnSbAg-based material of the present invention enables both of a solid solution effect of SnSb and a precipitation strengthening effect of SnAg.

(3) Wettability Test

On a DCB (direct copper bonding) substrate, a plate solder having 9.5 mm square and 0.25 mm in thickness was placed and heated under an $H_2$ reducing environment at 300° C. for 3 minutes to check the wettability of a solder. Note that the DCB substrate is a laminate substrate prepared by directly bonding a conductive metal plate made of copper or the like on both sides of an insulating layer such as alumina-based ceramics using Direct Copper Bond method. The plate solder was prepared using the compositions of Samples 9, 19, and 23 of Table 1. Two plate solders are placed on the DCB substrate per sample upon the test.

Figure 4:
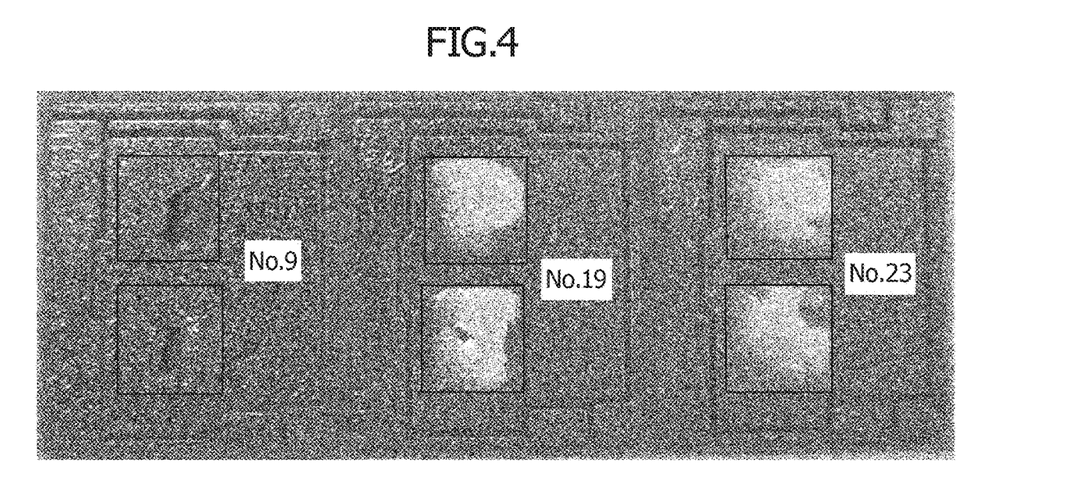
FIG. 4 is a photograph showing a wettability test result of a solder material according to the present invention.

FIG. 4 shows the results thereof. FIG. 4 is a stereoscopic micrograph of the solder on the DCB substrate after heating. The solder materials of the present invention have the high wettability. Among these, it can be visually observed that the oxidization of the solders of Samples 19 and 23 can be suppressed and the wettability of the solder is improved, compared with the solder of Sample 9, by adding of Ge. It is also observed that a wetting area of Sample 19 spreads in almost the same shape as the one before melting, and the solder is almost white, that is, Sn is not oxidized. Also, Sample 23 has the same or higher wettability. It is confirmed that the wettability is not at least decreased by the addition of Ni. Although not easy to find in the photographs of Samples 19 and 23, the solder spreads all over the region outlined in square.

(4) Heat-Resistance Test

Figure 5A:
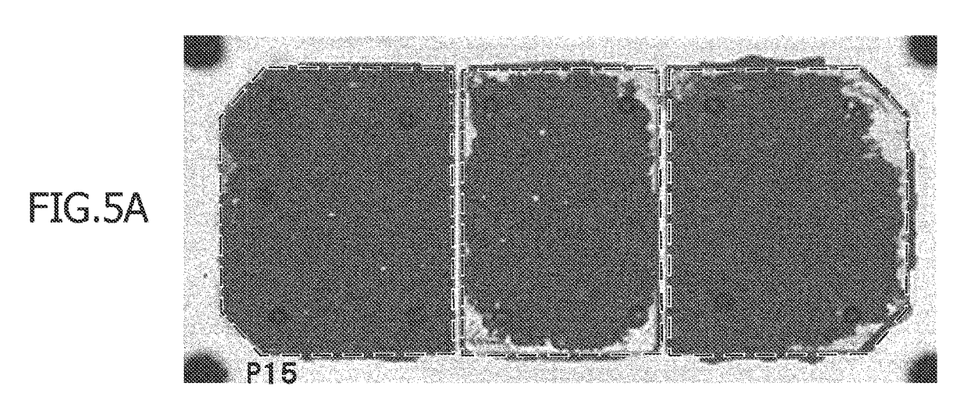
FIGS. 5A, 5B, and 5C are photographs showing a thermal shock test of a solder material according to the present invention.
Figure 5B:
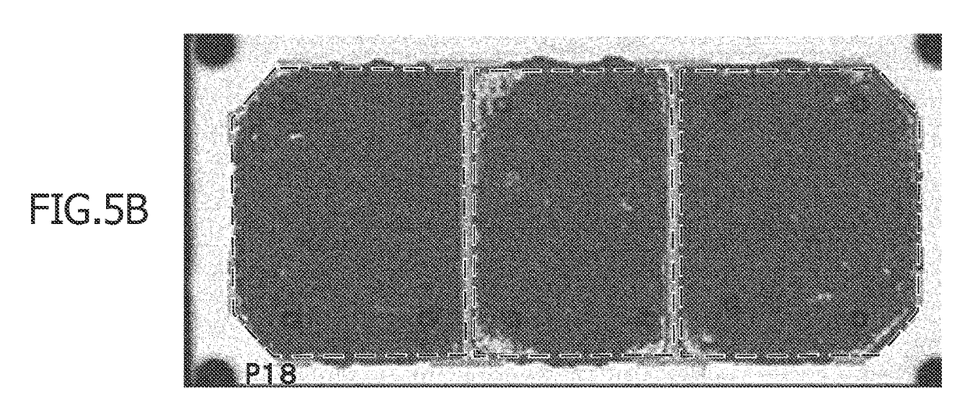
Figure 5C:
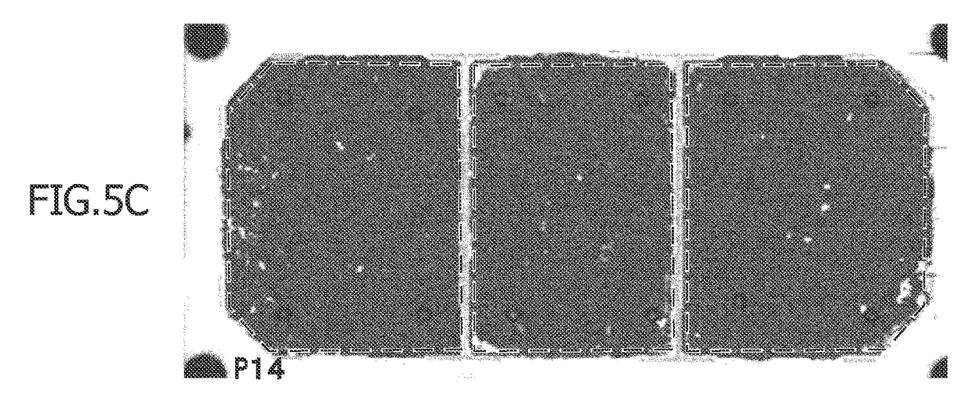

By using a 0.25 mm-thick plate solder having the compositions of Samples 5, 9, and 13 of Table 1, the DCB substrate and the radiator plate were bonded under the same bonding condition as Item (3) above. A thermal shock test was executed to evaluate the heat resistance of a solder. The test condition is that the substrate was held for 10 minutes at −45° C. to 155° C., and subjected to 300 cycles each consisting of holding at −45° C. and holding at 155° C. for 10 minutes. Next, it was confirmed by a ultrasonic inspection microscope whether the solder bonding portion is peeled off or cracked. FIGS. 5A, 5B, and 5C are photographs showing the results. FIG. 5A is a photograph of the solder of Sample 5; FIG. 5B, Sample 9; and FIG. 5C, Sample 13. The black portions in the figures indicate the solder bonding portions, and white portions indicate cracks, that is, failures of the solder. Regarding the determination as to cracks, in the solder material in which the white portions account for a large area in the initial solder bonding area indicated by the dotted frame, the cooling performance lowers and in turn, the solder bonding strength lowers. More specifically, the fewer the white portions, the higher the characteristics. Note that the white points at the center, etc. of the micrograph for each sample represent voids present before the test and do not imply the sites where a failure occurs in the solder upon the thermal shock test. The result of the thermal shock test reveals that heat resistance is higher in order of Samples 13, 9, and 5 and the service life is increased by the addition of Ni.

If Ni is added to SnSbAg, it serves as a solidification nucleus for the solidification of the SnSbAg composition, thereby providing fine polycrystal. Thus, it seems that the stress concentration due to the cold-heat cycle did not concentrate on the high-angle crystal grain boundaries with different crystal orientations, and the effect of dispersing the stress was exerted by the polycrystal. Also, it is thought that the SbSnNi phase and CuNiSn phase crystallized at solidification served to delay deterioration due to strengthened dispersion to the SbSn phase and the coarsening of the main Sn phase and the compound resulting from high temperature degradation. Note that the above explanation is given merely for understanding the present invention, and the present invention is not limited to a specific theory as above.

INDUSTRIAL APPLICABILITY

The solder material according to the present invention is used for general electronic devices with high current specifications in bonding portions of a semiconductor chip and the like. Specifically, it is suitably used for bonding of packaged components such as integrated circuits (ICs). In addition, it is suitably used for die bonding portions of components that generate a large amount of heat, e.g., power semiconductor devices such as light-emitting diodes (LEDs) or power diodes, and further for die bonding portions for internal connections of IC devices of general electronic components mounted on printed circuit boards.

REFERENCE SYMBOL LIST

10 bonding layer
11 semiconductor element
12 laminate substrate
13 radiator plate
14 aluminum wire
15 external terminal
16 case
17 resin sealing material
100 power module

The invention claimed is:

1. A solder material consisting of more than 5.0% by mass and 10.0% by mass or less of Sb and 2.0 to 4.0% by mass of Ag, and the remainder consisting of Sn and inevitable impurities, a thermal conductivity rate of the solder material at 100° C. to 200° C. being not lower than a thermal conductivity rate at 25° C.

2. A solder material comprising more than 5.0% by mass and 10.0% by mass or less of Sb; 2.0 to 4.0% by mass of Ag; and, 0.01 to 1.0% by mass of Ni, and the remainder consisting of Sn and inevitable impurities, a thermal conductivity rate of the solder material at 100° C. to 200° C. being not lower than a thermal conductivity rate at 25° C.

3. The solder material according to claim 2, further comprising more than 0 and 1.0% by mass or less of Si.

4. The solder material according to claim 2, further comprising 0.001 to 0.1% by mass of P.

5. The solder material according to claim 2, further comprising 0.001 to 0.1% by mass of Ge.

6. The solder material according to claim 3, further comprising 0.001 to 0.1% by mass of Ge.

7. The solder material according to claim 4, further comprising 0.001 to 0.1% by mass of Ge.

8. A semiconductor device comprising a bonding layer in which the solder material according to claim 1 is melted, between a semiconductor element and a substrate electrode or a lead frame.

9. The solder material according to claim 2, wherein the content of Ni is 0.01 to 0.5% by mass.

10. The solder material according to claim 2, wherein the content of Ni is 0.1 to 0.4% by mass.

11. The solder material according to claim 2, wherein Cu is present only as one of the inevitable impurities.

* * * * *